US011718085B2

(12) United States Patent
Fronczkiewicz et al.

(10) Patent No.: US 11,718,085 B2
(45) Date of Patent: Aug. 8, 2023

(54) METHOD FOR THERMALLY DEVELOPING RELIEF PRECURSORS

(71) Applicant: Flint Group Germany GmbH, Stuttgart (DE)

(72) Inventors: Peter Fronczkiewicz, Lake Wylie, SC (US); Andrew Knapp, Charlotte, NC (US); Torben Wendland, Renningen (DE); Martin Kunz, Waldbronn (DE)

(73) Assignee: Flint Group Germany GmbH, Stuttgart (DE)

( * ) Notice: Subject to any disclaimer, the term of this patent is extended or adjusted under 35 U.S.C. 154(b) by 24 days.

(21) Appl. No.: 16/577,296

(22) Filed: Sep. 20, 2019

(65) Prior Publication Data

US 2020/0094541 A1 Mar. 26, 2020

(30) Foreign Application Priority Data

Sep. 26, 2018 (EP) ..................................... 18196988

(51) Int. Cl.
| | | |
|---|---|---|
| *B41C 1/055* | (2006.01) | |
| *G03F 7/36* | (2006.01) | |
| *G03F 7/038* | (2006.01) | |
| *G03F 7/039* | (2006.01) | |

(52) U.S. Cl.
CPC ................ *B41C 1/055* (2013.01); *G03F 7/36* (2013.01); *G03F 7/038* (2013.01); *G03F 7/039* (2013.01)

(58) Field of Classification Search
CPC ....................................................... G03F 7/36
See application file for complete search history.

(56) References Cited

U.S. PATENT DOCUMENTS

| | | |
|---|---|---|
| 3,264,103 A | 8/1966 | Cohen et al. |
| 3,495,987 A | 2/1970 | Moore |
| 3,558,322 A | 1/1971 | Fan |
| 3,567,453 A | 3/1971 | Borden |
| 3,615,629 A | 10/1971 | Wilhelm et al. |
| 4,292,152 A | 9/1981 | Lechtken et al. |
| 4,343,891 A | 8/1982 | Aasen et al. |
| 4,504,573 A | 3/1985 | Ishikawa et al. |
| 4,517,277 A | 5/1985 | Lynch et al. |
| 4,713,401 A | 12/1987 | Riediker et al. |
| 4,743,528 A | 5/1988 | Farid et al. |
| 4,743,529 A | 5/1988 | Farid et al. |
| 4,743,530 A | 5/1988 | Farid et al. |
| 4,743,531 A | 5/1988 | Farid et al. |
| 4,849,307 A | 7/1989 | Hoffmann et al. |
| 4,857,654 A | 8/1989 | Riediker et al. |
| 4,910,121 A | 3/1990 | Riediker et al. |
| 4,987,056 A | 1/1991 | Imahashi et al. |
| 5,026,625 A | 6/1991 | Riediker et al. |
| 5,175,072 A | 12/1992 | Martens |
| 2005/0211120 A1* | 9/2005 | Markhart ................... G03F 7/36 101/401.1 |
| 2013/0108966 A1* | 5/2013 | Arnold ...................... G03F 7/40 430/306 |

FOREIGN PATENT DOCUMENTS

| | | |
|---|---|---|
| DE | 1522444 A1 | 7/1969 |
| EP | 0059988 A1 | 9/1982 |
| EP | 0079514 A2 | 5/1983 |
| EP | 0085472 A1 | 8/1983 |
| EP | 109772 A2 | 5/1984 |
| EP | 109773 A2 | 5/1984 |
| EP | 0224164 A2 | 6/1987 |
| EP | 0334338 A2 | 9/1989 |
| EP | 469735 A2 | 2/1992 |
| EP | 1674936 A2 | 6/2006 |
| EP | 3033236 A1 | 6/2016 |
| GB | 1279999 A | 6/1972 |
| JP | S4537377 B1 | 11/1970 |
| JP | S4642363 B1 | 12/1971 |
| JP | S4809005 B1 | 3/1973 |
| JP | S59152396 A | 8/1984 |
| JP | S59174831 A | 10/1984 |
| JP | S61151197 A | 7/1986 |
| JP | S6341484 A | 2/1988 |
| JP | S6314340 B2 | 3/1988 |
| JP | S63138345 A | 6/1988 |
| JP | S63142345 A | 6/1988 |

(Continued)

OTHER PUBLICATIONS

Davidson, "Exploring the Science, Technology and Applications of U.V. and E.B. Curing", Surface Coatings Technology, 1999, 6 pages.
Dietliker, "Chehemistry & technology of UV & EB formulation for coatings, inks & paints", Photoinitiators for Free Radical and Cationic Polymerisation, vol. 3, 1991, 8 pages.
Fouassier, "Radiation curing in polymer science and technology", Fundamentals and Methods, 1993, 4 pages.
Chatterjee, S., et al., "Photochemistry of Carbocyanine Alkyltriphenylborate Salts: Intra-Ion-Pair Electron Transfer and the Chemistry of Boranyl Radicals", Journal of American Chemistry Society, 1990, vol. 112, pp. 6329-6338.
Davidson, R., "The chemistry of photoinitiators—some recent developments", Journal of Photochemistry and Biology A: Chemistry, 1993, vol. 73, pp. 81-96.
Eaton, I.D.F., et al., Journal of the American Chemical Society, 1980, vol. 102, pp. 3278-3281.

(Continued)

*Primary Examiner* — Chanceity N Robinson
(74) *Attorney, Agent, or Firm* — Faegre Drinker Biddle & Reath LLP

(57) ABSTRACT

A method of thermal development of flexographic printing elements, having steps of: fixing a relief precursor a movable support; repeatedly moving the support in a multitude of movement cycles; heating the relief precursor to a temperature sufficient to cause the uncured portions of the photopolymer layer to soften or liquefy; contacting with a development medium; Single movement cycles are carried out with different heating powers and different contacting with the developing medium such that one may improve the registration accuracy of the printing element, ease removal of functional layers, smoothen the relief plate precursor surface, and address heat build-up problem.

18 Claims, No Drawings

(56) References Cited

FOREIGN PATENT DOCUMENTS

| | | | | |
|---|---|---|---|---|
| JP | S63142346 A | 6/1988 | | |
| JP | S63143537 A | 6/1988 | | |
| JP | H01152109 A | 6/1989 | | |
| JP | H1304453 A | 12/1989 | | |
| JP | H024705 A | 1/1990 | | |
| JP | H02000249 A | 1/1990 | | |
| WO | WO-9614603 A1 | 5/1996 | | |
| WO | WO-0118604 A2 * | 3/2001 | ............... | G03F 7/36 |
| WO | WO-200118604 A2 | 3/2001 | | |
| WO | WO-200188615 A1 | 11/2001 | | |
| WO | WO-200190818 A1 | 11/2001 | | |
| WO | WO-2015023571 A1 | 2/2015 | | |
| WO | WO-2017207005 A1 | 12/2017 | | |

OTHER PUBLICATIONS

Fouassier, J.P., "Photoinitiated Polymerization Theory and Applications", Rapra Review, Rapra Technology, 1998, vol. 9, pp. 1-23.

Maslak, P., "Fragmentations by Photoinduced Electron Transfer, Fundamentals and Practical Aspects", Topics in Current Chemistry, 1993, vol. 168, pp. 1-46.

Monroe, B., et al., "Photoinitiators for Free-Radical-Initiated Photoimaging Systems", Chem. Rev., Chemical Review, 1993, vol. 93, pp. 435-448.

Saeva, F., "Photoinduced Electron Transfer (PET) Bond Cleavage Reactions", Topics in Current Chemistry, 1990, vol. 156, No. 59, pp. 60-92.

Shirai, M., et al., "Photoacid and Photobase Generators: Chemistry and Applications to Polymeric Materials", Prog. Polym. Sci., 1996, vol. 21, pp. 1-45.

* cited by examiner

METHOD FOR THERMALLY DEVELOPING RELIEF PRECURSORS

CROSS-REFERENCE TO RELATED APPLICATIONS

This application claims priority to European Application No. 18196988.2, filed Sep. 26, 2018, which is incorporated herein by reference in its entirety.

The invention concerns a method for the preparation of flexographic printing elements using a thermal development whereby an image wise exposed relief precursor is developed by heating the element and removing the softened non-cured material. The removal of softened material is achieved by continuously contacting it with an absorbing material. The absorbing developer material may be a non-woven of polyamide, polyester, cellulose or inorganic fibers onto which the softened material is adhering and subsequently removed.

Such methods are described for example in U.S. Pat. Nos. 3,264,103, 5,175,072, WO 96/14603 or WO 01/88615. Alternatively WO 01/90818 proposed to treat the exposed relief precursor with a hot gas or fluid jet to remove the non-cured material. In EP-A 469 735 and WO 01/18604 devices capable to perform the above mentioned methods are described.

Even though the technology is on the market for quite a while, there are still some problems to be solved.

One of which is that thermally developed flexographic printing elements exhibit poor registration. A perfect registration is important because when multiple colors are to be printed, several printing elements have to be made which print the different colors at the exact same position. If the registration does not match there are misalignments and color deviations visible on the print. Due to thermal loading during thermal development the printing elements may be deformed due to limited dimensional stability of the printing element components. Hence one object of the present invention is to improve the registration accuracy.

Another problem is the removal of functional layers which are arranged above the photosensitive layer. Such functional layers are used e.g. as integral mask or barrier layer. Typically these layers are made from other materials than the photosensitive layer and have different thermal properties. For example these functional layers may soften at higher or lower temperatures than the photosensitive layer or have different adhesion tendency towards the developer material. Therefore it is a further object to provide a method which allows an easier or faster removal of such functional layers.

During the thermal development process the developer material is pressed against the relief precursor in order to adhere non-cured material and due to its inherent structure the surface remaining is not smooth but exhibits impressions corresponding to the fibrous structure of the developer material. Such rough surfaces may have negative influence on the printing results, such as poor ink transfer or ink lay down. It is therefore a further object to provide a method to smoothen the relief plate precursor surface.

Another problem may arise upon frequent use of the processor due to heat buildup within the support on which the relief precursor is fixed. In such cases the results obtained may be inconsistent when compared at the beginning and the end of a working period. In order to compensate the effect costly and complicated cooling means for the support are necessary. Hence it is a further object to provide a method which increases consistency.

The problem is solved by a method for thermally developing a relief precursor comprising a supporting layer and photopolymer layer having cured and uncured portions comprising the steps:
(a) fixing the relief precursor with the supporting layer adjacent to a movable support;
(b) repeatedly moving the support with the relief precursor fixed thereon in a multitude of movement cycles;
(c) heating the relief precursor to a temperature sufficient to cause the uncured portions of the photopolymer layer to soften or liquefy;
(d) contacting the relief precursor with a development medium to allow the liquefied material of the uncured portions to be adhered to and removed by the development medium;
wherein the heating and contacting is carried out in cycles A, B, C or D each corresponding to a single movement cycle such that
(i) in a cycle A, the relief precursor is heated with higher heating power and not contacted the relief precursor with the development medium;
(ii) in a cycle B, the relief precursor is heated with higher heating power and contacted with the development medium;
(iii) in a cycle C, the relief precursor is not heated or heated with lower heating power and contacted with the development medium;
(iv) in a cycle D, the relief precursor is not heated or heated with lower heating power and not contacted with the development medium;
wherein cycle B is carried out once or more and at least one of cycles A, C or D is carried out once or more.

A relief precursor to be used with the claimed processes is described in the following: A relief plate precursor generally comprises a supporting layer made of a first material and an additional layer made of a second material which is different from said first material. The supporting layer may be a flexible metal, a natural or artificial polymer, paper or combinations thereof. Preferably the supporting layer is a flexible metal or polymer film or sheet. In case of a flexible metal, the supporting layer could comprise a thin film, a sieve like structure, a mesh like structure, a woven or non-woven structure or a combination thereof. Steel, copper, nickel or aluminium sheets are preferred and may be about 50 to 1000 μm thick. In case of a polymer film, the film is dimensionally stable but bendable and may be made for example from polyalkylenes, polyesters, polyethylene terephthalate, polybutylene terephthalate, polyamides and polycarbonates, polymers reinforced with woven, non-woven or layered fibres (e.g. glass fibres, Carbon fibres, polymer fibres) or combinations thereof. Preferably polyethylene and polyester foils are used and their thickness may be in the range of about 100 to 300 μm, preferably in the range of 100 to 200 μm.

A relief precursor may carry an additional layer. For example, the additional layer may be any one of the following: a direct engravable layer (e.g. by laser), a solvent or water developable layer, a thermally developable layer, a photosensitive layer, a combination of a photosensitive layer and a mask layer. Optionally there may be provided one or more further additional layers on top of additional layer. Such one or more further additional layers may comprise a cover layer at the top of all other layers which is removed before the imageable layer is imaged. The one or more additional layers may comprise a relief layer, and an antihalation layer between the supporting layer and the relief layer or at a side of the supporting layer which is opposite of the relief layer. The one or more additional layers may comprise a relief layer, an imageable layer, and one or more barrier layers between the relief layer and the imageable layer which prevent diffusion of oxygen. Between the different layers described above one or more adhesion layers may be located which ensure proper adhesion of the different layers.

The relief precursor comprises at least a photosensitive layer and a mask layer. The mask layer may be ablated or changed in transparency during the treatment and forms a mask with transparent and non-transparent areas. Underneath of transparent areas of the mask the photosensitive layer undergoes a change in solubility and/or fluidity upon irradiation. The change is used to generate the relief by removing parts of the photosensitive layer in one or more subsequent steps. The change in solubility and/or fluidity may be achieved by photo-induced polymerization and/or crosslinking, rendering the irradiated areas less soluble and less meltable. In other cases the electromagnetic radiation may cause breaking of bonds or cleavage of protective groups rendering the irradiated areas more soluble and/or meltable. Preferably a process using photo-induced crosslinking and/or polymerization is used.

The relief precursor comprises a photosensitive layer comprising at least a photo-initiator or a photo-initiator system, a binder and a reactive compound or monomer. A photo-initiator is a compound which upon irradiation with electromagnetic radiation may form a reactive species which can start a polymerization reaction, a crosslinking reaction, a chain or bond scission reaction which leads to a change of the solubility and/or meltability of the composition. Photo-initiators are known which cleave and generate radicals, acids or bases. Such initiators are known to the person skilled in the art and described e.g. in: Bruce M. Monroe et al., Chemical Review, 93, 435 (1993), R. S. Davidson, Journal of Photochemistry and Biology A: Chemistry, 73, 81 (1993), J. P. Faussier, Photoinitiated Polymerization-Theory and Applications: Rapra Review, Vol. 9, Report, RapraTechnology (1998), M. Tsunooka et al., 25 Prog. Polym. Sci., 21, 1 (1996), F. D. Saeva, Topics in Current Chemistry, 1 56, 59 (1990), G. G. Maslak, Topics in Current Chemistry, 168, I (1993), H. B. Shuster et al., JAGS, 112, 6329 (1990) and I. D. F. Eaton et al., JAGS, 102, 3298 (1980), P. Fouassier and J. F. Rabek, Radiation Curing in Polymer Science and Technology, pages 77 to 117 (1993) or K. K. Dietliker, Photoinitiators for free Radical and Cationic Polymerisation, Chemistry & Technology of UV & EB Formulation for Coatings, Inks and Paints, Volume, 3, Sita Technology LTD, London 1991; or R. S. Davidson, Exploring the Science, technology and Applications of U.V. and E.B. Curing, Sita Technology LTD, London 1999. Further initiators are described in JP45-37377, JP44-86516, U.S. Pat. Nos. 3,567, 453, 4,343,891, EP109772, EP109773, JP63138345, JP63142345, JP63142346, JP63143537, JP4642363, JP59152396, JP61151197, JP6341484, JP2249 and JP24705, JP626223, JPB6314340, JP1559174831, JP1304453 and JP1152109.

Binders are linear, branched or dendritic polymers which may be homopolymers or copolymers. Copolymers can be random, alternating or block copolymers. As binder, those polymers which are either soluble, dispersible or emulsifiable in either aqueous solutions, organic solvents or combinations of both are used. Suitable polymeric binders are those conventionally used for the production of letterpress printing plates, such as completely or partially hydrolyzed polyvinyl esters, for example partially hydrolyzed polyvinyl acetates, polyvinyl alcohol derivatives, e. g. partially hydrolyzed vinyl acetate/alkylene oxide graft copolymers, or polyvinyl alcohols subsequently acrylated by a polymer-analogous reaction, as described, for example, in EP-A-0079514, EP-A-0224164 or EP-A-0059988, and mixtures thereof. Also suitable as polymeric binders are polyurethanes or polyamides which are soluble in water or water/alcohol mixtures, as described, for example, in EP-A-00856472 or DE-A-1522444. For flexographic printing precursors elastomeric binders are used. The thermoplastic-elastomeric block copolymers comprise at least one block which consists essentially of alkenylaromatics, and at least one block which consists essentially of 1,3-dienes. The alkenylaromatics may be, for example, styrene, α-methylstyrene, or vinyltoluene. Styrene is preferable. The 1,3-dienes are preferably butadiene and/or isoprene. These block copolymers may be linear, branched, or radial block copolymers. Generally speaking, they are triblock copolymers of the A-B-A type, but they may also be diblock polymers of the A-B type, or may be polymers having a plurality of alternating elastomeric and thermoplastic blocks. A-B-A-B-A, for example. Mixtures of two or more different block copolymers may also be used. Commercial triblock copolymers frequently include certain fractions of diblock copolymers. The diene units may be 1.2- or 1.4-linked. Also possible for use, furthermore, are thermoplastic elastomeric block copolymers with styrene and blocks and a random styrene-butadiene middle block. Use may also be made, of course, of mixtures of two or more thermoplastic-elastomeric binders, provided that the properties of the relief-forming layer are not negatively impacted as a result. As well as the stated thermoplastic-elastomeric block copolymers, the photopolymerizable layer may also comprise further elastomeric binders other than the block copolymers. With additional binders of this kind, also called secondary binders, the properties of the photopolymerizable layer can be modified. Examples of a secondary binder are vinyltoluene-a-methylstyrene copolymers. These polymer binders account for in general from 20 to 98%, preferably from 50 to 90, % by weight of the total amount of the layer. Reactive compounds or monomers which are suitable for the preparation of the mixtures are those which are polymerizable and are compatible with the binders. Useful monomers of this type generally have a boiling point above 100° C. They usually have a molecular weight of less than 3000, preferably less than 2000. The ethylenically unsaturated monomers used ought to be compatible with the binders, and they have at least one polymerizable, ethylenically unsaturated group. As monomers it is possible in particular to use esters or amides of acrylic acid or methacrylic acid with mono- or polyfunctional alcohols, amines, aminoalcohols or hydroxyethers and hydroxyesters, esters of fumaric acid or maleic acid, and allyl compounds. Esters of acrylic acid or methacrylic acid are preferred. Preference is given to 1,4-butanediol diacrylate, 1,6-hexanediol diacrylate, 1,6-hexanediol dimethacrylate, 1,9-nonanediol diacrylate, or trimethylolpropane tri(meth)acrylate. Mixtures of different monomers can of course be used. The total amount of all the monomers used in the relief-forming layer together is generally 1 to 20 wt %, preferably 5 to 20 wt %, based in each case on the sum of all the constituents of the relief-forming layer. The amount of monomers having two ethylenically unsaturated groups is preferably 5 to 20 wt %, based on the sum of all constituents of the relief-forming layer, more preferably 8 to 18 wt %.

The photosensitive layer may comprise further components. The further components are selected from the group consisting of a further polymer, a filler, a plasticizer, an anti-blocking agent, a monomer, an additive (e.g. a stabilizer, a dye), a stabilizer, a crosslinker, a binder, a color forming compound, a dye, a pigment, an antioxidant and combinations thereof.

The relief precursor comprises a photosensitive layer as described above and a mask layer, the mask layer comprising at least a compound capable of absorbing electromagnetic radiation and a component capable of being removed by ablation (also known as digital plate precursor). Preferably the mask layer is an integral layer of the relief precursor and is in direct contact with the photosensitive layer or with a functional layer disposed between photosensitive layer and mask layer. This functional layer is preferably a barrier layer and blocks oxygen. The mask layer may be imageable by ablation and removable by solvents or by thermal development. The mask layer is heated and removed by irradiation with high energy electromagnetic radiation, whereby an image wise structured mask is formed, which is used to transfer the structure onto the relief precursor. In order to do so the mask layer may be non-transparent in the UV region and absorb radiation in the VIS-IR region of the electromagnetic spectrum. The VIS-IR radiation may then be used to heat and ablate the layer. The optical density of the mask layer in the UV region between 330 and 420 nm is in the range of 1 to 5, preferably in the range of 1.5 to 4 and more preferably in the range of 2 to 4.

The layer thickness of the ablatable mask layer may be in the range of 0.1 to 5 µm, preferably 0.3 to 4 µm, more preferably 1 to 3 mm. The laser sensitivity of the mask layer (measured as energy needed to ablate 1 $cm^2$) may be in the range of 0.1 to 10 $J/cm^2$, preferably in the range of 0.3 to 5 $J/cm^2$, most preferably in the range of 0.5 to 5 $J/cm^2$.

In process step (a) the relief precursor is fixed on a movable support whereby the supporting layer is in contact with a movable support. Fixation may be performed e.g. using adhesive layers on the movable support or clamping means at the leading and/or trailing edge or combinations thereof. As movable support a rotating drum, a circulating endless belt or a set of small rollers arranged in a circular fashion may be used as described for example in EP1674936A2, EP3033236A1 or WO2017207005A1.

In process steps (b) the relief precursor on the support is moved in a repeatedly manner e.g. by rotating a drum, circulating an endless belt or by moving it over a circular set of rollers. Whenever the leading edge of the relief precursor passes the starting location a full movement cycle is completed. During process steps (b) a multitude of movement cycles is performed and the repetition may be periodic or irregular. Such movements are performed using equipment known to the person skilled in the art and may comprise motors, gears, pistons and combinations thereof. In order to prevent thermal overload of the relief precursor, especially the supporting layer, the movable support may be cooled. Cooling may be performed e.g. by passing a cooling liquid through the moving support or by treating the backside e.g. of a moving belt with a cooling fluid such as water and/or air or other gases. In a preferred manner forced cooling as described above is not applied because the process may be conducted in a way that it is not necessary.

In process steps (c) the relief precursor is heated to a temperature sufficient to cause the uncured portions of the photopolymer layer to soften or liquefy. The temperature naturally depends very much on the nature of the materials used within the relief precursor. The temperature of the (surface of the) relief precursor is in the range of 50 to 300° C., preferably in the range of 50 to 250° C., more preferably in the range of 60 to 230° C. and most preferably in the range of 60 to 200° C. Heating the relief precursor may be performed to any means known to the person skilled in the art. For example heating may be achieved by heated rollers pressed against the precursor surface, or by directing hot fluid or gas towards the surface of the precursor or by irradiation of the precursor surface with electromagnetic radiation, friction, ultrasound and combinations thereof.

In process steps (d) the relief precursor is contacted with a development medium to which the softened or liquefied material adheres. The development medium is conveyed in a continuous fashion preferably at a speed which matches the speed of the precursor surface. The conveying means to unwind the development material from a roll, to pass it along the precursor surface and to wind it onto another roll are known to the person skilled in the art. With the detachment of the developing material the softened or liquefied material is removed and a relief is formed.

Contacting of the development medium may be performed in several ways known to a person skilled in the art. For example a heated roller may be used to press the development material against the relief precursor, or two or more rollers may be used to assure a large contact area between the relief precursor and the development material. It is preferable to also heat the development material to some extent in order to avoid too severe cooling of the softened precursor material. In order to prevent contamination of the rolls with softened precursor material and frequent cleaning, an addition thin foil may be used and arranged in between the rollers and the developer material.

The process steps (c) and (d) described above can be arranged in different cycles.

In a cycle A, the relief precursor is heated at a higher heating power while being moved and not in contact with the development medium. This cycle allows to treat the relief precursor with heat only. It can be used to bring a lot of energy into the precursor, especially, when it is repeated several times. This can be advantageous, when the material to be softened or liquefied has to be heated to a high temperature and or a relatively thick section of the precursor surface needs to be heated. When such a cycle or several cycles are performed at the beginning of the development process it is possible to heat and remove layers which have a higher softening temperature or require a longer time to reach that temperature than the layers underneath. It may also be used in the cases when layers have a lower softening temperature or require a shorter time to reach that temperature than the layers underneath. This can help to reduce contamination of the roller which presses the developer material against the relief precursor when the heating is performed in a way that the viscosity of the material to be removed remains high enough not to penetrate through the developer material or to prevent dripping of that layer form the precursor and contaminating the equipment. The cycle A may also be used at the end of a developing process and keep the temperature of the relief precursor at a certain level or even increase it further. Doing so it is possible to allow the precursor material to flow for a longer time before it is cooled and the structure gets frozen. In this way it is possible to smoothen the surface of a relief precursor. The other process parameters e.g. speed of movement, pressure, heating power etc. may be the same or different than in previous or following cycles.

In a cycle B, the relief precursor is heated with higher heating power and contacted with the development medium, preferably contacting and heating are performed simultaneously. This is the standard cycle in which heating and removal of softened or liquefied material is performed. In this case the heating, pressure of contact and speed of the precursor can be adopted to the requirements of the current layer to be removed. For this cycle the heating as well as the other process parameters may be the same or different than in previous or following cycles.

The heating may be performed either with the heated roll which contacts the developer medium with the relief precursor or with an additional heat source which heats the precursor or both. Heating of the heated roll may be performed by electrical heating, a heating fluid or gas. Preferably electrical heating is used. The heating of the heated roll is performed such that a certain temperature is set kept constant during a cycle or a sequence of cycles. The power of the heating of the heated roll is in the range of 100 to 10000 W, preferably in the range of 500 to 8000 W, more preferably in the range of 100 to 5000 W. A lower heating power in case of the heated roll refers to a lower temperature setting.

Additional heating may be achieved for example by heated rollers pressed against the precursor surface, or by directing hot fluid or gas towards the surface of the precursor or by irradiation of the precursor surface with electromagnetic radiation, friction, ultrasound and combinations thereof. Preferably additional heating is performed by hot gas or IR heaters. The heating power of an IR heater for example is in the range of 100 to 10000 W, preferably in the range of 500 to 8000 W, more preferably in the range of 100 to 5000 W.

In a cycle C, the relief precursor is not heated or heated with lower heating power and contacted with the development medium. Lower heating power can be realized by lowering the temperature of the heated roll and/or lowering power of the additional heat source or switching it off. Using this cycle softened or liquefied material may be removed while there is no or only little heat transferred into the relief precursor. In this manner material can be removed without additional heat transfer which helps to keep the thermal stress of the rest of the deeper sections of the relief precursor low. In addition it reduces heat buildup in the movable support, results in more consistent results and can make cooling of the movable support obsolete. In addition cycle C may be used to obtain surfaces with a higher roughness when the developer material is pressed into the surface while this is cooling. In some cases a rougher surface can improve ink density on the print. For this cycle the heating as well as the other process parameters may be the same or different than in previous or following cycles.

In a cycle D, the relief precursor is not heated or heated with lower heating power and not contacted with the development medium. In this cycle no or little heat is transferred into the relief precursor and consequently it will cool. Cycle D can be used to reduce the thermal stress of the deeper sections of a relief precursor and also reduce heat buildup in the moving support. Therefore cycle D may be used in between two cycles B or after cycle A. For this cycle the heating as well as the other process parameters may be the same or different than in previous or following cycles.

A lower heating power means using the additional heat source in a range of 1 to 90%, preferably in the range of 5 to 80%, more preferably in the range of 10 to 80% of the heating power used in cycle A. The heating power is adjusted to heat the precursor to a desired temperature in the range of 50 to 300° C. The heating power of the additional heat source is in the range of 1 to 9000 W, preferably in the range of 50 to 6500 W, more preferably in the range of 10 to 4000 W. The heating power may be controlled for example by a phase angle fired solid state relay (SSR), which controls the output power between as dictated by an analog output on a programmable logic controller (PLC) (0 VDC being 0% power, 10 VDC being 100% power). In phase angle controls for example, the analog signal to the silicone controlled rectifier (SCR) may directly set the point on the AC voltage waveform at which the solid state relays will be switched on which in turn varies the power.

Also the heated roll may be operated at lower temperature and the temperature may be in the range of 20 to 300° C., preferably in the range of 20 to 250° C., more preferably in the range of 20 to 230° C. and most preferably in the range of 20 to 200° C. In order to control the temperature of the heated roll the electric heater may be switched in and off with different intervals. Control is performed using a temperature sensor and a feedback loop (e.g. using a Proportional-Integral-Derivative). All other possibilities, known to the person skilled din the art may be used as well.

The surface power density delivered to the plate in a cycle is in the range of about 0.001 to 500 W/cm$^2$, preferably in the range of about 0.001 to 200 W/cm$^2$, more preferably in the range of about 0.01 to 100 W/cm$^2$, most preferable in the range of about 0.05 to 50 W/cm$^2$.

The cycles may be performed in any sequence but at least one cycle B is carried out to remove material and at least one cycle A, C or D is carried out at least once.

In some embodiments at least two cycles B are carried out. At least one cycle A, C or D is carried out at least once. With this sequence material is removed while controlling the temperature of the relief precursor.

In further embodiments, at least one cycle A is carried out before a cycle B, C or D is carried out. In preferred embodiments, at least one cycle A is carried out before the first cycle B. With this sequence more heat can be transferred, a higher temperature may be reached to soften or liquefy layers at higher temperatures or to heat thicker sections.

In further embodiments at least one cycle A is carried out as the last cycle before the process is stopped and the relief precursor is cooled or removed from the device. In preferred embodiments, at least one cycle A is carried out immediately after the last cycle B has been carried out. In other embodiments, after the last cycle A one or more cycles D may follow. These sequences are especially relevant when smoothing of the relief precursor surface shall be achieved.

In further embodiments, at least one cycle C is carried out after at least one cycle B has been carried out. With a sequence like this material may be removed without additional heat transfer and can be used to control the temperature and to reduce thermal stress in deeper sections of the precursor.

A further embodiments, at least one cycle D is carried out after at least one cycle B has been carried out. As for previous sequences this one allows to control the temperature and to reduce thermal stress in deeper sections of the precursor even when one or a number of conventional cycles B are performed.

In a preferred embodiment, a sequence of alternating cycles B and D is carried out. An alternating sequence of cycles B and D is the preferred sequence, when a large amount of material needs to be removed while keeping the temperature of the deeper sections of the precursor low and preventing thermal stress.

In further embodiments, a sequence of at least two cycles B is carried out, followed by a sequence of alternating cycles B and D. With such a sequence upper layers may be removed fast whereas lower layers are removed while keeping the temperature of the deeper sections of the precursor low and preventing thermal stress.

In general, 2 to 50 cycles are carried out. Preferably the number of cycles is in the range of 2 to 40, more preferably in the range of 3 to 30 and most preferably in the range of 4 to 30. The number of the different cycles in a sequence can be varied in a wide range. Typically the number of cycles is $A_m B_n C_o D_p$ with m=0-20, n=1-40, o=0-20, p=0-20. The number of cycles depends on the several factors. One of which is the thickness of the precursor. In case of a thick precursor more material needs to be removed and consequently the number of cycles is higher. Other factors are the thickness and number of layers with different thermal properties to be removed. The more and the thicker the layers the higher the number of cycles. Higher sensitivity of the precursor material to thermal stress requires more cooling cycles and hence increases the number of cycles.

Also sequences with blocks build by identical cycles may be performed, e.g. $AB_3C$, $AB_3CD$, $A_rB_nDBDB$, AABBCDBBCBCBA, AABBDDBBDBDBA, AABABABCC, $(BD)_qA_r$, $A_r(BD)_qA_r$, $(BD)_nC_t$, $(BBD)_n$, Wherein n, q, r or t is 0 to 30. Also alternating more than two cycles is possible e.g. ABCABC, ABDABD, BCDBCD and so on.

A preferred embodiment concerns the method described above, wherein the movable support is a rotating drum. The drum may be equipped with a conformal and tack layer which ensures good contact to the relief precursor. In addition it may carry clamping means which may be used to fix the leading and/or the trailing edge of a relief precursor. The clamping means may be movable to adjust for different plate sizes. The drum may be equipped with a cooling system which is used to keep the temperature of the drum and also the relief precursor constant. The drum may be a solid cylinder or a hollow cylinder. Preferably a hollow cylinder is used due to its lower weight and the better heat transfer to the ambient surrounding. The drum radius is in the range of 5 to 100 cm, preferably in the range of 5 to 80 cm, more preferably in the range of 10 to 80 cm and most preferably in the range of 10 to 60 cm. The length of the drum is in the range of 50 to 500 cm, preferably in the range of 50 to 300 cm, more preferably in the range of 60 to 200 cm and most preferably in the range of 80 to 150 cm.

A preferred embodiment concerns the method described above, wherein the movable support is moving with a speed of 0.2 to 10 m/min, preferably with a speed of 0.3 to 10 m/min, more preferably with a speed of 0.3 to 8 m/min, most preferably with a speed of 0.4 to 5 m/min. The speed of the movable support may be varied and adjusted according to the specific requirements of the relief precursor. In case materials that heat up fast and/or are present in a thin layer only may allow higher speeds than materials that heat up slowly and/or are present in thicker layers. Usually the speed of the movable support is matched by the speed of the developer material. The speed of the movable support may be the same or different for different cycles and may also be changed within a cycle.

A preferred embodiment concerns the method described above, wherein the heating is carried out by means of infrared heating. The IR source is placed close to the nip and heats the relief precursor before it enters the nip. The heat delivered by the IR source is controllable and is adjusted according to the actual requirements. Preferably the heating is performed using IR light in the wavelength region of 800 to 20000 nm.

A preferred embodiment concerns the method described above, wherein in cycles B or C the development medium contacting the relief precursor is pressed against the surface of the relief precursor by means of a heated roll. The heated roll may be heated by any means known to the person skilled in the art and may be selected e.g. from the group comprising electrical heaters, heaters employing hot fluid, IR sources placed next to the roll and combinations thereof. The heat delivered by the heater is controllable and sensors are used to check the actual condition as well as to play a significant role in the corresponding feedback system. The length of the heated roll is the same or larger than the movable support. The diameter of the heated roll is significantly smaller than the diameter of the rotating drum. The heated roll is capable to be moved towards the moving support and back. The pressure with which the heated roll is pressed against the movable support can be controlled. The pressure is below 1400 kPa (200 PSI), preferably in the range of 1 to 1000 kPa, more preferably in the range of 100 to 1000 kPa, most preferably in the range of 100 to 700 kPa. The pressure may be the same or different for different cycles and may also be changed within a cycle.

A preferred embodiment concerns the method described above, wherein in cycles A or B the relief precursor is heated to a temperature from 50 to 300° C., preferably from 50 to 250° C., more preferably from 60 to 230° C. and most preferably from 60 to 200° C. The temperature applied depends on the thermal properties of the layers on the relief precursor that need to be removed and on the thermal sensitivity of the precursor with respect to thermal stress. Materials with a low softening or liquefying temperature naturally require lower temperatures than materials with a higher softening temperature.

A preferred embodiment concerns the method described above, wherein the development medium is selected from the group comprising non-woven fibrous materials, fibrous woven materials, a porous material and a foam and combinations thereof. The developer material typically is a thin band like material which provides adhesive properties towards the softened or liquefied material. In addition the developer material has to be mechanically stable at the temperatures employed during the process. It may be a rough film, a porous film, a fabric or a non-woven fiber material or a combination thereof. It may be made of an organic or inorganic material, a natural or artificial material, preferably it is an artificial polymer and more preferably it is a non-woven material made from polymer fibers. The polymer fibers are typically polyesters, polyamides, polyesters, polyvinyl polymers and combinations thereof. Preferably polyester and polyamide fibers are used. The thickness of the developer material is in the range of 10 to 1000 μm, preferably in the range of 50 to 500 μm, more preferably in the range of 100 to 500 μm and most preferably in the range of 100 to 400 μm. The weight per area of the developer material is in the range of 10 to 100 g/m², preferably in the range of 20 to 100 g/m², more preferably of 40 to 90 g/m², most preferably of 40 to 80 g/m².

With respect to mechanical properties the developer material should have a tensile strength in the range of 1 to 1000 kPa, preferably in the range of 10 to 800 kPa, more preferably in the range of 20 to 600 kPa, most preferably in the range of 30 to 500 kPa.

The method described above may be a part of a longer process sequence and pre-treatment steps as well as post-treatment steps may be performed. Pre-treatment steps may be selected from the group comprising an exposure to electromagnetic radiation, a temperature treatment, a treatment with liquids or gases, an application of an additional layer or combinations thereof. Preferably an image forming ablation of a mask layer attached to the relief precursor is performed: alternatively a separate mask is attached to the precursor. In both cases an exposure to electromagnetic radiation through the mask layer to alter the softening or liquefying properties of the precursor material follows. Post-treatment steps may be selected from the group comprising an exposure to electromagnetic radiation, a temperature treatment, a treatment with liquids or gases, an application of an additional layer or combinations thereof. Preferably on or more exposure to electromagnetic radiation is performed wherein the wavelength is in the UV range from 200 to 400 nm, preferably in the range from 250 to 400 nm, more preferably in the range from 300 to 400 nm, most preferably in the range from 320 to 390 nm.

Whilst the principles of the invention have been set out above in connection with specific embodiments, it is to be understood that this description is merely made by way of example and not as a limitation of the scope of protection which is determined by the appended claims.

EXAMPLES

Example 1

Plate precursors with a SIS based photopolymer layer on a polyester substrate, an integrated mask layer and a thickness of 114 mm was used for the following procedures. First a mask comprising different structures was created by ablation using a Thermoflexx 80 apparatus (Xeikon) under the following conditions: The mask comprised lines with a width of about 90 μm and different orientation. 6 lines with a length of 305 mm perpendicular and 6 lines with a length of 485 mm parallel to the short side of the precursor. The length of the lines created during mask formation La was measured using a glass ruler (Electronic Scale ESM-25/1000). Then the precursors were exposed for 8 minutes using a nyloflex NExT FV Exposure apparatus with 19 mW/cm2. These precursors were then processed in an nyloflex Xpress Thermal Processor FIV (Flint Group) comprising an unwinding and winding mechanism for the developing material, a rotating rum whereon the precursor is attached, a heated roll with a maximum power of 3300 W and an IR heater delivering 3825 W at 100% power (80% relate to 3060 W and 40% relates to 1530 W). These precursors were processed at a precursor speed of 1,778 cm/sec (0.7 inch/second) for all cycles, temperature of heated roll at 162.8° C. (325° F.), with a pressure of 413.7 kPa (60 PSI), the IR power at 40% in case of cycle B. For cycle C the heated roll was heated to 162.8° C. with a pressure of 413.7 kPa (60 PSI) and the IR heater was switched off. For cycle D the heated roll did not touch the plate precursor and the IR heater was switched off. The sequences according table 1 were used. Afterwards the length of the lines created on the cliché Lc were measured using a glass ruler and compared to the length of the lines created during mask formation (after ablation) La. For each line the difference Δac=La−Lc was calculated. In the following the standard deviation SD for Δac was calculated and is used as a measure for the accuracy and registration quality. The smaller SD the better the accuracy and the registration quality.

TABLE 1

| Example | Cycle sequence | SD normalized to 1a | Registration on print |
|---|---|---|---|
| 1a (reference) | 10 × B | 1 | poor |
| 1b | 10 × BD alternating | 0.58 | Very good |
| 1c | 3 × BD alternating followed by 7 × B | 0.94 | poor |
| 1d | 7 × B followed by 3 × BD alternating | 0.87 | Acceptable |
| 1e | 7 × B followed by 3 × C | Not determined | Acceptable |
| 1f | 7 × B followed by 2 × C and 1 × D | Not determined | Acceptable |

The results from table 1 show that using cycles D and/or C improves the registration quality which might be due to relaxation of the photopolymer layer during the additional cycles and/or due to less thermal stress.

Example 2

Plate precursors with a SBS based photopolymer layer on a polyester substrate, an integrated mask layer based on polyamide and a thickness of 114 mm was used for the following procedures. First a mask comprising different structures was created by ablation using a Thermoflexx 80 apparatus (Xeikon) under the following conditions: The mask comprised different areas, one of which represents a solid area of 70 mm by 25 mm. Then the precursors were exposed for 10 minutes using a nyloflex NExT FV (Flint Group) Exposure apparatus with 19 mW/cm2. After Exposure the precursors were processed in an nyloflex Xpress Thermal Processor FIV (Flint Group) according to the settings in table 2. An Erichsen mini glossmaster 60° (Modell 507 M) was used to determine the gloss of the solid area created. The measurement was repeated 10 times and the average was calculated. The higher the gloss value, the smoother the surface.

TABLE 2

| Example | Cycles | Temperature heated roll (° C.) | IR power (%) | Pressure (kPa) | Precursor speed (cm/sec) | Gloss 60° normalized to 2a |
|---|---|---|---|---|---|---|
| 2a reference | 10 × B | 162.8 | 40 | 413.7 | 1.778 | 1 |
| 2b | 10 × B | 162.8 | 40 | 413.7 | 1.778 | 1.01 |
|  | 1 × A | — | 40 | 0 | 1.778 |  |
| 2c | 10 × B | 162.8 | 40 | 413.7 | 1.778 | 1.04 |
|  | 3 × A | — | 40 | 0 | 1.778 |  |
| 2d | 10 × B | 162.8 | 40 | 413.7 | 1.778 | 1.16 |
|  | 1 × A | — | 80 | 0 | 1.778 |  |
| 2e | 10 × B | 162.8 | 40 | 413.7 | 1.778 | 1.27 |
|  | 3 × A | — | 80 | 0 | 1.778 |  |
| 2f | 9 × B | 162.8 | 40 | 413.7 | 1.778 | 1.18 |
|  | 1 × A | — | 80 | 0 | 1.778 |  |

From table 2 it is obvious that using cycles A and B can be used to generate smoother surfaces by reducing the marks formed by the web structure.

Example 3

Plate precursors with a SIS based photopolymer layer on a polyester substrate, an integrated mask layer based on polyvinyl acetate and a thickness of 114 mm was used for the following procedures. The precursors were processed in a nyloflex Xpress Thermal Processor FIV (Flint Group) according to the settings in table 3. When a lot of mask material remained after the cycles the result was rated −.

When some mask material remained after the cycles the result was rated 0. When almost all mask material was removed the result was rated +. When all mask material was removed the result was rated ++.

TABLE 3

| Example | Cycles | Temperature heated roll (° C.) | IR power (%) | Pressure (kPa) | Precursor speed (cm/sec) | removal of mask layer |
|---|---|---|---|---|---|---|
| 3a reference | 1 × B | 162.8 | 40 | 413.7 | 1.778 | – |
| 3b reference | 2 × B | 162.8 | 40 | 413.7 | 1.778 | – |
| 3c | 2 × A | — | 20 | 0 | 1.778 | + |
|  | 1 × B | 162.8 | 40 | 413.7 | 1.778 |  |
| 3d | 1 × A | — | 20 | 0 | 1.778 | 0 |
|  | 1 × B | 162.8 | 40 | 413.7 | 1.778 |  |
| 3e | 1 × A | — | 40 | 0 | 1.778 | + |
|  | 1 × B | 162.8 | 40 | 413.7 | 1.778 |  |
| 3f | 1 × A | — | 70 | 0 | 1.778 | ++ |
|  | 1 × B | 162.8 | 40 | 413.7 | 1.778 |  |

From table 3 it is obvious that using cycles A improves the removal of the integrated mask layer significantly and with increasing IR power the results are improving.

The invention claimed is:

1. A method for thermally developing a relief precursor comprising a supporting layer and photopolymer layer having cured and uncured portions comprising the steps:
    (a) fixing the relief precursor with the supporting layer adjacent to a movable support;
    (b) repeatedly moving the movable support with the relief precursor fixed thereon in a multitude of movement cycles; each movement cycle being such that whenever a leading edge of the relief precursor passes a starting location a full movement cycle is completed;
    wherein the multitude of movement cycles comprises at least one full movement cycle B and at least one full movement cycle A; wherein:
    in each full movement cycle A, the relief precursor is heated with heating power and not contacted with the development medium, so that the relief precursor is treated with heat only;
    in each full movement cycle B, the relief precursor is heated with a heating power which is sufficient to cause the uncured portions of the photopolymer layer to soften or liquefy, and the relief precursor is contacted with a development medium to allow the softened or liquefied uncured portions to be adhered to and removed by the development medium.

2. The method of claim 1, wherein a sequence of at least two cycles B is carried out.

3. The method of claim 1, wherein at least one cycle A is carried out before a first cycle B of at least one cycle B is carried out.

4. The method of claim 1, wherein at least one cycle A is carried out after a last cycle B of at least one cycle B has been carried out.

5. The method of claim 1, wherein at least one cycle C is carried out after at least one cycle B has been carried out, wherein each cycle C comprises contacting the relief precursor and not heating the relief precursor or heating the relief precursor with a heating power lower than a heating power used in the at least one cycle A, wherein the heating power used in cycle C is 1 to 90% of the heating power used in the at least one cycle A.

6. The method of claim 1, wherein at least one cycle D is carried out after at least one cycle B has been carried out, wherein each cycle D comprises not contacting the relief precursor and not heating the relief precursor or heating the relief precursor with a heating power which is lower than a heating power used in the at least one cycle A, wherein the heating power used in cycle D is 1 to 90% of the heating power used in the at least one cycle A.

7. The method of claim 6, wherein a sequence of alternating cycles B and D is carried out.

8. A method for thermally developing a relief precursor comprising a supporting layer and photopolymer layer having cured and uncured portions comprising the steps:
    (a) fixing the relief precursor with the supporting layer adjacent to a movable support;
    (b) repeatedly moving the movable support with the relief precursor fixed thereon in a multitude of movement cycles;
    wherein the multitude of movement cycles comprises at least two cycles B, followed by a sequence of alternating cycles B and D, wherein
    in each cycle B, the relief precursor is heated with a heating power which is sufficient to cause the uncured portions of the photopolymer layer to soften or liquefy, and the relief precursor is contacted with a development medium to allow the softened or liquefied uncured portions to be adhered to and removed by the development medium;
    in each cycle D, the relief precursor is not heated, and not contacted with the development medium.

9. The method of claim 1, wherein 3 to 50 cycles are carried out.

10. The method of claim 1, wherein the movable support is a rotating drum.

11. The method of claim 1, wherein the heating is carried out by means of infrared heating.

12. The method of claim 1, wherein in the at least one cycle B the development medium contacting the relief precursor is pressed against the surface of the relief precursor by means of a heated roll.

13. The method of claim 12, wherein in the at least one cycle A and in the at least one cycle B the relief precursor is heated to a temperature from 50 to 300° C.

14. The method of claim 1, wherein the movable support is moving with a speed of 0.2 to 10 m/min.

15. The method of claim 1, wherein the development medium is selected from the group comprising non-woven fibrous materials, fibrous woven materials, a porous material and a foam and combinations thereof.

16. A method for thermally developing a relief precursor comprising a supporting layer and photopolymer layer having cured and uncured portions comprising the steps:
    (a) fixing the relief precursor with the supporting layer adjacent to a movable support;
    (b) repeatedly moving the movable support with the relief precursor fixed thereon in a multitude of movement cycles; each movement cycle being such that whenever a leading edge of the relief precursor passes a starting location a movement cycle is completed;
    wherein the multitude of movement cycles comprises at least one cycle B and at least one cycle D; wherein:
    in each cycle B, the relief precursor is heated with a heating power which is sufficient to cause the uncured portions of the photopolymer layer to soften or liquefy, and the relief precursor is contacted with a development medium to allow the softened or liquefied uncured portions to be adhered to and removed by the development medium;

in each cycle D, the relief precursor is not heated, and the relief precursor is not contacted with the development medium.

17. The method of claim 16, wherein at least one cycle D is carried out after at least one cycle B has been carried out.

18. The method of claim 16, wherein a sequence of alternating cycles B and D is carried out.

\* \* \* \* \*